(12) United States Patent
Yoon et al.

(10) Patent No.: US 7,560,057 B2
(45) Date of Patent: Jul. 14, 2009

(54) METHOD FOR PRODUCING MOLDING COMPOUND RESIN TABLET FOR WAVELENGTH CONVERSION, AND METHOD FOR MANUFACTURING WHITE LIGHT EMITTING DIODE BY USING THE PRODUCTION METHOD

(75) Inventors: Joon Ho Yoon, Seoul (KR); Seon Goo Lee, Kyungki-Do (KR); Doo Hoon Ahn, Kyungki-Do (KR)

(73) Assignee: Samsung Electro-Mechanics Co., Ltd., Suwon, Kyungki-Do (KR)

( * ) Notice: Subject to any disclaimer, the term of this patent is extended or adjusted under 35 U.S.C. 154(b) by 294 days.

(21) Appl. No.: 11/617,844

(22) Filed: Dec. 29, 2006

(65) Prior Publication Data

US 2007/0120290 A1    May 31, 2007

Related U.S. Application Data

(62) Division of application No. 10/867,816, filed on Jun. 16, 2004, now Pat. No. 7,157,029.

(30) Foreign Application Priority Data

Nov. 19, 2003    (KR) .............................. 2003-82136

(51) Int. Cl.
*B29C 43/20* (2006.01)
(52) U.S. Cl. .................. 264/112; 264/1.7; 264/109; 264/115
(58) Field of Classification Search .............. None
See application file for complete search history.

(56) References Cited

U.S. PATENT DOCUMENTS

| | | | |
|---|---|---|---|
| 5,714,090 A | 2/1998 | Waters et al. | |
| 6,482,664 B1 | 11/2002 | Lee et al. | |
| 7,157,029 B2 * | 1/2007 | Yoon et al. | 264/109 |
| 2003/0001140 A1 * | 1/2003 | Starkey | 252/301.35 |
| 2005/0098916 A1 | 5/2005 | Umetsu et al. | |
| 2005/0264194 A1 * | 12/2005 | Ng et al. | 313/512 |

FOREIGN PATENT DOCUMENTS

| | | |
|---|---|---|
| JP | 49-48175 | 12/1974 |
| JP | 60-257548 A | 12/1985 |
| JP | 2000-208815 A | 7/2000 |

(Continued)

OTHER PUBLICATIONS

Japanese Patent Office, Office Action mailed Oct. 2, 2007 and English Translation.

*Primary Examiner*—Mary Lynn F Theisen
(74) *Attorney, Agent, or Firm*—Lowe Hauptman Ham & Berner

(57) ABSTRACT

Disclosed herein is a method for producing a molding compound resin tablet for wavelength conversion. The method comprises the steps of wet-dispersing a phosphor powder in a translucent liquid resin to form a molding compound resin body in which the phosphor powder is dispersed, and grinding the molding compound resin body into a powder form and applying a predetermined pressure to the resin powder. Further disclosed is a method for manufacturing a white light emitting diode using the molding compound resin tablet by a transfer molding process.

14 Claims, 8 Drawing Sheets

FOREIGN PATENT DOCUMENTS

| | | |
|---|---|---|
| JP | 2002-76444 A | 3/2002 |
| JP | 2002-12161 A | 4/2002 |
| JP | 2003-176334 A | 6/2003 |
| KR | 50-10354 | 2/1975 |
| KR | 0348377 | 7/2002 |
| KR | 10-0533097 | 11/2005 |

\* cited by examiner

METHOD FOR PRODUCING MOLDING COMPOUND RESIN TABLET FOR WAVELENGTH CONVERSION, AND METHOD FOR MANUFACTURING WHITE LIGHT EMITTING DIODE BY USING THE PRODUCTION METHOD

RELATED APPLICATIONS

This application is divisional of U.S. application Ser. No. 10/867,816, filed Jun. 16, 2004, which claims priority from Republic of Korea Application Serial Number 2003-82136, filed Nov. 19, 2003, the disclosures of which are hereby incorporated by reference herein in their entirety.

BACKGROUND OF THE INVENTION

1. Field of the Invention

The present invention relates to a method for manufacturing a white light emitting diode, and more particularly to a method for producing a molding compound resin tablet for wavelength conversion which is capable of ensuring uniform distribution of a phosphor and a method for manufacturing a white light emitting diode by using the production method.

2. Description of the Related Art

Generally, since light emitting diodes (LEDs) have advantages in terms of monochromatic peak wavelengths, a high light efficiency and a small size, light efficiency and miniaturization, they have been widely used as display devices and light sources. Among these LEDs, white light emitting diodes are progressively utilized as high output and high efficiency light sources which can replace backlights of illuminators or display devices.

Such white light emitting diodes are predominantly manufactured by a wavelength conversion process wherein a phosphor is applied onto a blue or UV light emitting diode to convert the blue or UV light to white light.

FIG. 1 is a cross-sectional view of a white light emitting diode package 10 fabricated in accordance with a conventional method.

Referring to FIG. 1, the white light emitting diode package 10 comprises two lead frames 3 and 4, a blue light emitting diode 5 mounted on a cap 3a of the lead frame 3, and a transparent molding portion 8 formed on the lead frames 3 and 4. Both electrodes of the blue light emitting diode 5 are electrically connected to wires 6 and 7, which are connected to lead frames 3 and 4, respectively.

A resin 9 including a Y—Al—Ga (YAG)-based phosphor is molded inside the cap 3a formed on the lead frames 4 so as to surround the blue LED 5. The blue LED 5 emitting blue light can produce the desired white light by combining a portion of light excited into yellowish green light having a peak wavelength of 555 nm and a portion of blue light directly emitted from the LED.

Commonly, the resin 9 containing the phosphor is formed on the LED 5 by a dispensing process using a liquid resin.

However, the dispensing process is not suitable for mass-production when compared to other molding processes. In addition, since the dispensing process uses a liquid resin, phosphor particles may be precipitated in the liquid resin during curing of the liquid resin. The precipitation of the phosphor particles causes non-uniform dispersion in the resin layer 9 surrounding the LED 5. The light converted from the resin layer 9 in which the phosphor is non-uniformly dispersed partially exhibits a yellowish white or bluish white color, resulting in non-uniformity in color.

In order to solve the above-mentioned problems of the prior art, a white light emitting diode manufactured by a transfer molding process is proposed in Korean Patent No. 348377, which was issued on Jul. 9, 2002. According to this patent, as shown in FIG. 2, the white light emitting diode is manufactured by a method comprising the steps of mixing a phosphor powder with a molding compound resin powder, e.g., an epoxy molding compound powder (step S21), shaping the mixture into a molding compound resin tablet (step S25), and transfer-molding a blue light emitting diode using the tablet (step S29) to manufacture the desired white light emitting diode.

Since the method employs a transfer molding process having a relatively short curing time, it has advantages that deterioration in the light conversion efficiency due to the precipitation of phosphor particles can be prevented, and at the same time, the mass-production of the white light emitting diode can be enhanced.

However, since the phosphor powder and the molding compound resin powder having different specific gravities and particle sizes are mixed with each other to produce the molding compound resin tablet, it is difficult to realize uniform distribution of the phosphor powder in the tablet.

Despite the advantages of the transfer molding process, the white light emitting diode thus manufactured still emits yellowish white or bluish white light, and thus it is difficult to manufacture a light emitting diode having a high light conversion efficiency.

SUMMARY OF THE INVENTION

Therefore, the present invention has been made in view of the above problems, and it is an object of the present invention to provide a method for producing a tablet containing a phosphor powder wherein the phosphor powder is dispersed so as to maximize the effects of a transfer molding process having a short curing time.

It is another object of the present invention to provide a method for manufacturing a white light emitting diode having good white light emitting efficiency by using the method for producing a tablet.

In order to accomplish the above objects of the present invention, there is provided a method for producing a molding compound resin tablet for wavelength conversion in which a phosphor converting at least a portion of wavelengths is uniformly dispersed, comprising the steps of: wet-dispersing a phosphor powder in a translucent liquid resin to form a molding compound resin body in which the phosphor powder is dispersed; and grinding the molding compound resin body into a powder form, and applying a predetermined pressure to the resin powder.

The wet dispersion process employed in the method of the present invention is performed depending on the addition time of the phosphor powder.

In one embodiment of the present invention, the step of forming the molding compound resin body includes the sub-steps of: mixing the translucent liquid resin, a material containing at least a curing agent and the phosphor powder; kneading the mixture in a gel state; and stabilizing the kneaded mixture to form the molding compound resin body containing the phosphor.

Preferably, the kneading is carried out at a temperature between about 100° C. and about 120° C., and the formation of the molding compound resin body is carried out by quenching the kneaded mixture.

Following the kneading, the step of forming the molding compound resin body may further include a sub-step of roll-milling the kneaded mixture to further disperse the phosphor prior to stabilizing.

More specifically, the phosphor powder may be simultaneously mixed with the translucent liquid resin and the material containing at least a curing agent. Alternatively, the translucent liquid resin and the phosphor powder are first mixed (1st mixing), and then the material containing at least a curing agent is added to the mixture and mixed (2nd mixing). Alternatively, the translucent liquid resin and the material containing at least a curing agent are first mixed (1st mixing), and then the phosphor powder is added to the mixture and mixed (2nd mixing).

In the case where the phosphor powder is mixed in the 2nd mixing, at least one agent selected from a catalyst and a coupling agent is added together with the phosphor powder. In this embodiment, it is preferred that at least one agent selected from a catalyst and a coupling agent and the phosphor powder are added in a mixture form obtained by the same milling process.

The wet dispersion process employed in the method of the present invention is accomplished by mixing the translucent liquid resin and the material containing at least a curing agent to partially proceed a reaction to form a gelled mixture, adding the phosphor powder thereto and kneading the mixture.

The phosphor may be a fluorescent material including at least one element selected from the group consisting of Y, Lu, Sc, La, Gd, Ce and Sm, and at least one element selected from the group consisting of Al, Ga and In. A representative example of the translucent liquid resin is an epoxy resin.

In accordance with another aspect of the present invention, there is provided a method for manufacturing a white light emitting diode by using the production method of the tablet described above.

Specifically, the method for manufacturing a white light emitting diode comprises the steps of: wet-dispersing a phosphor powder in a translucent liquid resin to form a molding compound resin body in which the phosphor powder is dispersed; grinding the molding compound resin body into a powder form, and applying a predetermined pressure to the resin powder to produce a molding compound in a tablet form; and transfer-molding the molding compound tablet on a package structure on which a blue or UV light emitting diode is mounted. The white light emitting diode thus manufactured is molded with the molding compound resin for wavelength conversion in which the phosphor converting at least a portion of wavelengths is uniformly dispersed.

The method of the present invention is characterized in that a wet dispersion process using a translucent liquid resin is employed to produce a molding compound resin tablet, instead of simple mixing of powders, thereby ensuring uniform dispersion of a phosphor powder in the molding compound resin tablet. The wet dispersion process can be realized by a mixing process for the formation of a molding compound resin body, without the need for further processing.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

The present invention will now be described in more detail with reference to the accompanying drawings.

Figure 3:
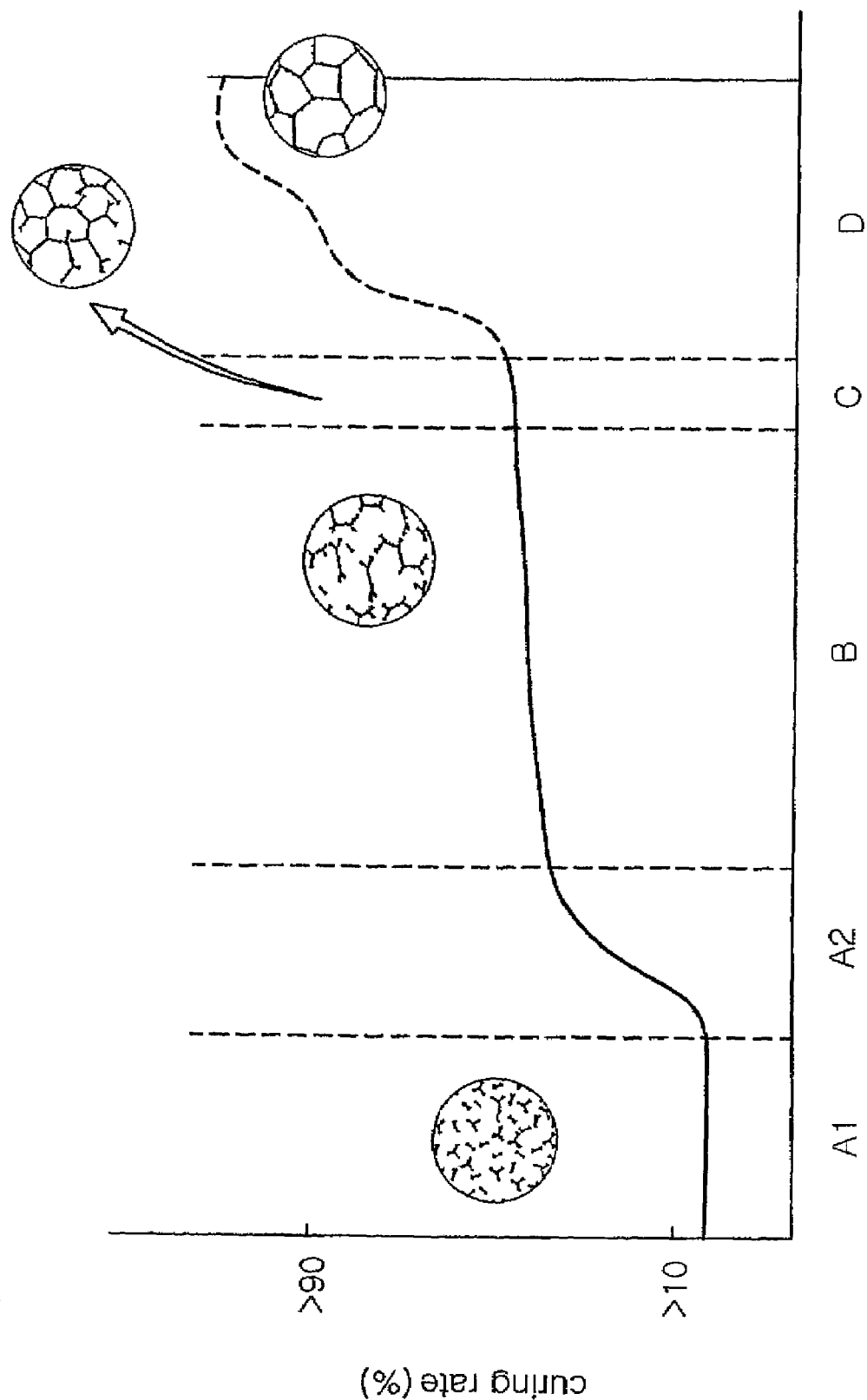
FIG. 3 is a graph showing change in the curing rate (%) with respect to each step of a method for producing a molding compound resin tablet for wavelength conversion according to the present invention.

FIG. 3 is a graph showing change in the curing rate (%) with respect to each step of a method for producing a molding compound resin tablet for wavelength conversion according to the present invention. Referring to FIG. 3, morphologies of each step as the curing reaction progresses are schematically shown. It is understood that FIG. 3 and the following description will help in determining the time and conditions for wet dispersion of a phosphor powder.

First, a translucent liquid resin such as an epoxy resin and a curing agent are mixed with each other (stage A1). Specifically, the translucent liquid resin and the curing agent undergo a curing reaction (curing rate: >10%), and are then mixed with each other using a mixer (stage A2). The curing rate is increased to a level of 40% to form a gel having a uniform fluidity. At this mixing step, an additive such as a catalyst or a coupling agent may be additionally added.

Thereafter, the gelled mixture is subjected to a kneading process (B) for more uniform mixing. At this step, the mixture is melt-mixed at a temperature capable of maintaining the gel state.

A phosphor powder can be wet-dispersed in the mixture for forming a molding compound resin body at stages A1, A2 and (or) B. At these stages, since the mixture for forming a molding compound resin body is maintained in a liquid or gel state, the phosphor powder can be uniformly dispersed in an effective manner. That is, since the phosphor powder is added during mixing of the translucent liquid resin and the curing agent in a liquid state or kneading of the gelled mixture, the phosphor powder can be much more uniformly dispersed than when in a powder form.

This dispersion of the phosphor powder can be performed by a conventional mixing and/or kneading process for the formation of a molding compound resin body, without the need for further processing.

Next, the mixture is quenched to form a molding compound resin body in a solid state. The molding compound resin body is then ground into a powder, and is then pressurized to produce a molding compound resin tablet in which the phosphor is uniformly dispersed. At this step, the molding compound resin tablet is in a stable state in which no curing reaction is progressed (stage C).

The molding compound resin tablet produced by the method of the present invention can be completely cured for a relatively short curing time by a transfer molding process for manufacturing a white light emitting diode (represented by a dashed line in stage D). Since the transfer molding process using the tablet requires a curing time shorter than a dispensing process using a common liquid resin, little or no precipitation of the phosphor particles already uniformly dispersed in the molding compound tablet takes place, thus forming a layer exhibiting high wavelength conversion efficiency.

As described above with reference to FIG. 3, since the phosphor powder is mixed with a mixture in a liquid or gel state, it can be effectively dispersed in the molding compound resin tablet. In addition, the method of the present invention can be variously performed depending on the addition time of the phosphor powder.

Figure 4:
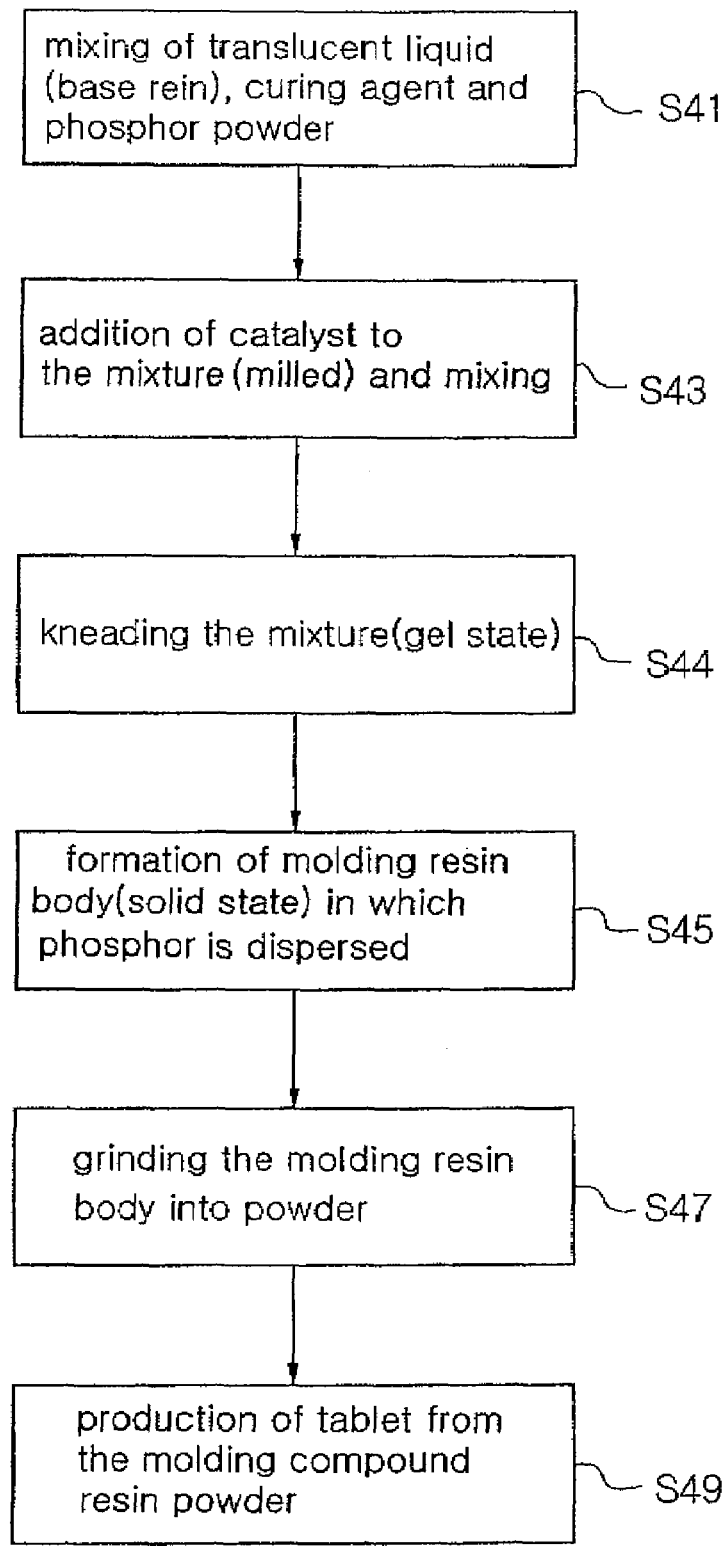
FIGS. 4 to 6 are flow charts schematically illustrating embodiments of a method for producing a molding compound resin tablet for wavelength conversion according to the present invention.
Figure 5:
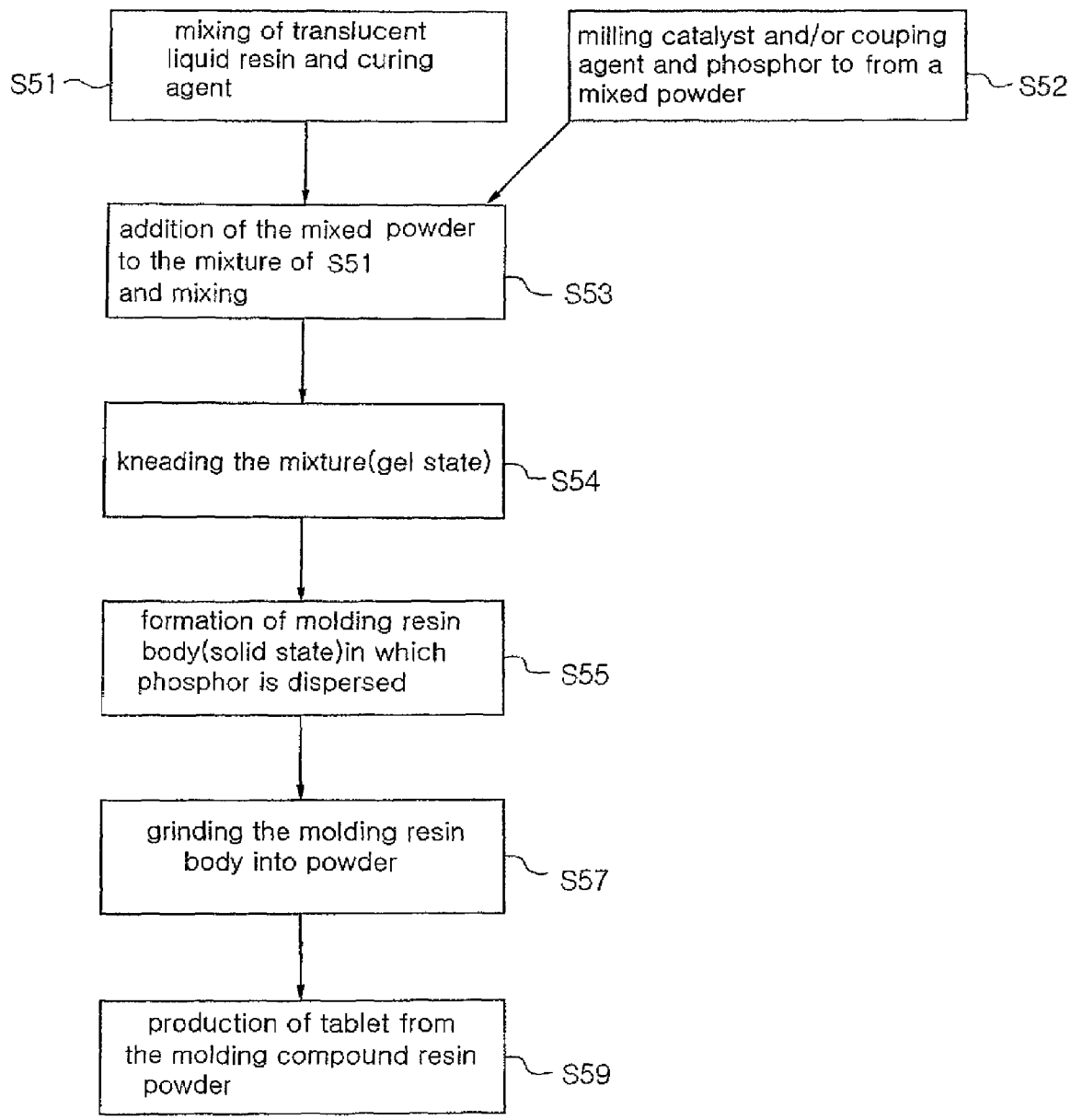
Figure 6:
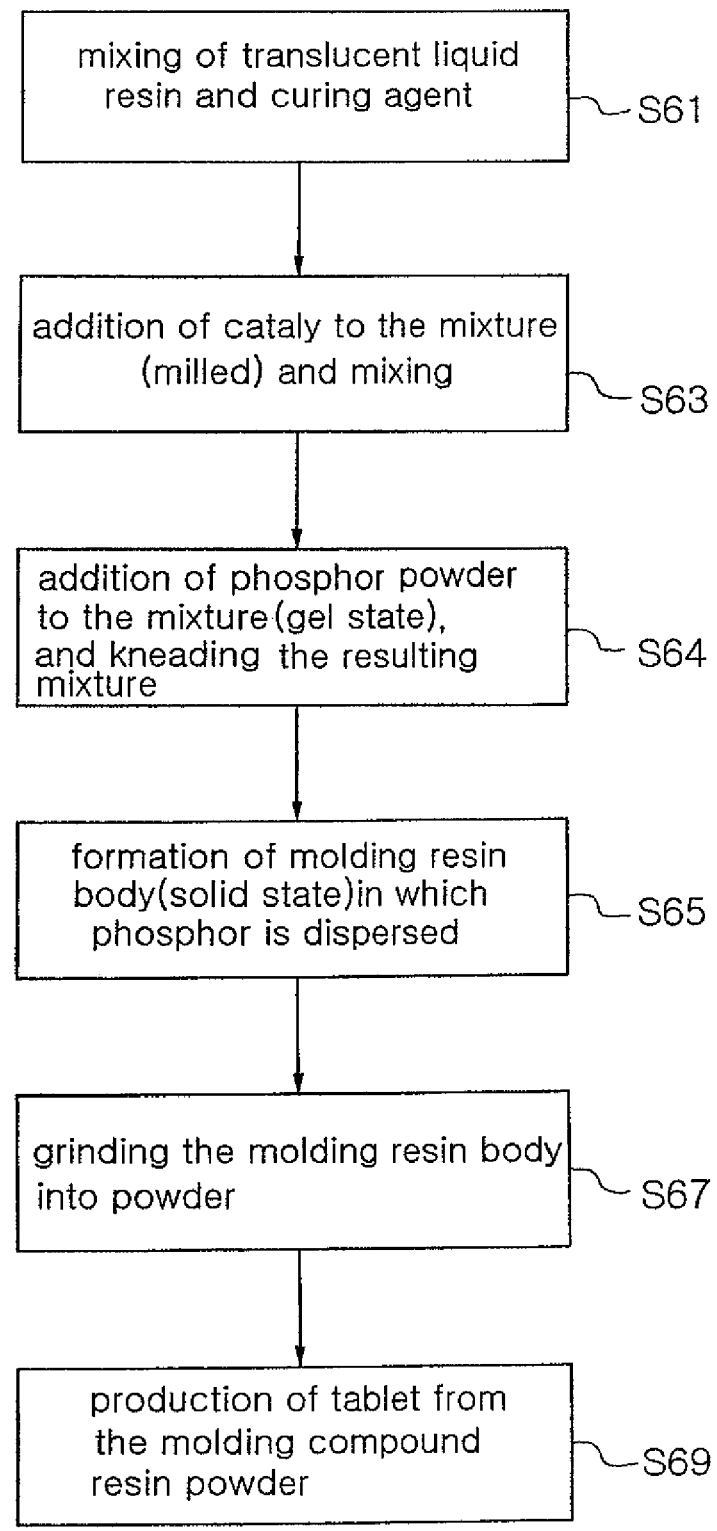

FIGS. 4 to 6 illustrate various embodiments of the method for producing a molding compound resin tablet for wavelength conversion according to the present invention.

FIG. 4 shows an embodiment wherein a translucent liquid resin, a curing agent and a phosphor are simultaneously added and mixed.

The method of the present embodiment begins from the step of mixing a translucent liquid resin, a material containing at least a curing agent and a phosphor powder (step S41). More specifically, the phosphor powder is first mixed with the translucent liquid resin and then the curing agent is added to the mixture, and vice versa. Alternatively, the translucent liquid resin, the curing agent and the phosphor powder may be simultaneously added and mixed. Through these mixing processes, the phosphor powder can be uniformly dispersed in the translucent liquid resin as a base resin.

The phosphor is a material containing at least one element selected from the group consisting of Y, Lu, Sc, La, Gd, Ce and Sm, and at least one element selected from the group consisting of Al, Ga and In. A representative example of the phosphor is a YAG-based phosphor. For more uniform dispersion, the phosphor employed in the present invention is preferably in the form of a powder having an average particle diameter of 5~50 microns.

In step S43, an additive for forming a molding compound resin may be further mixed. Examples of suitable additives include curing catalysts, coupling agents, release agents and modifying agents already known in the art. For more uniform mixing, these additives are formed into a powder through a milling process, and are then added to the mixture.

Next, the resulting mixture is subjected to a kneading process in a gel state (step S44). The kneading process refers to a process wherein a mixture cured to some extent is uniformly mixed at a temperature sufficient to maintain the gel state. The kneading process is preferably performed at a temperature between about 100° C. and about 120° C.

Subsequently, the resulting kneaded mixture is stabilized to form a molding compound resin body containing the phosphor (step S45). The molding compound resin body thus formed is a solid state resin in which the phosphor powder is uniformly dispersed through the mixing and the kneading processes. At this step, the mixture kneaded at high temperature is quenched. Prior to the quenching, i.e. stabilization, the kneaded mixture may be subjected to a rolling process in order to pursue uniform dispersion of the phosphor powder.

The molding compound resin body thus formed is ground into a powder (step S47). Finally, a predetermined pressure is applied to the resin powder to produce a molding compound resin tablet in which the phosphor is uniformly dispersed (step S49).

FIG. 5 shows an embodiment wherein a phosphor powder is added along with a catalyst and a coupling agent.

The method of the present embodiment begins from the step of mixing a translucent liquid resin and a material containing at least a curing agent (step S51). As the translucent liquid resin usable in the present invention, an epoxy resin may be mentioned. Thereafter, a phosphor and other additives are prepared in an appropriate powder form in the early stage of the mixing step (step S51), i.e. in a state wherein the curing reaction is not sufficiently progressed (step S52). Examples of suitable additives include curing catalysts, coupling agents, release agents and modifying agents already known in the art. For more uniform mixing, these additives can be formed together with the phosphor into a powder through a milling process. Consequently, the phosphor can be prepared into a powder without undergoing an additional milling process.

The mixed powder of the phosphor and the additive thus prepared are mixed with the translucent liquid resin and the curing agent (step S53), and then the resulting mixture is subjected to a kneading process (step S54) in a gel state. As stated above, the kneading process is preferably performed at a temperature between about 100° C. and about 120° C. for more uniform dispersion of the mixture.

Subsequently, the resulting kneaded mixture is stabilized to form a molding compound resin body containing the phosphor (step S55). The molding compound resin body thus formed is a solid state resin in which the phosphor powder is uniformly dispersed through the mixing and the kneading processes. As explained above, the formation of the molding compound resin body is carried out by quenching the kneaded mixture. Prior to the quenching, the kneaded mixture may be subjected to a rolling process.

The molding compound resin body thus formed is ground into a powder (step S57). Finally, a predetermined pressure is applied to the resin powder to produce a molding compound resin tablet in which the phosphor is uniformly dispersed (step S59).

FIG. 6 shows an embodiment wherein a phosphor powder is wet-dispersed by a kneading process.

As explained above, a phosphor powder may be mixed with a translucent liquid or a mixture having a low curing rate (less than 30%), or may be dispersed in a gelled mixture (e.g., curing rate: 30~40%) by a kneading process.

The method according to the present embodiment begins from the step of mixing the translucent liquid resin and a material containing at least a curing agent (step S61). Thereafter, a milled additive powder is added to the mixture in the early stage of the mixing step, i.e. in a state wherein the curing reaction is not sufficiently progressed (step S63). Examples of suitable additives include curing catalysts, coupling agents, release agents and modifying agents already known in the art.

Then, the resulting mixture and a phosphor powder are subjected to a kneading process (step S64) in a gel state. As stated above, the phosphor powder prepared in an appropriate powder form may be added before or during kneading. The phosphor powder is wet-dispersed in a gelled mixture by a kneading process. This kneading process is preferably performed at a high temperature of from about 100° C. to about 120° C. so that the phosphor powder can be uniformly dispersed in the gelled mixture.

Subsequently, the resulting kneaded mixture is stabilized to form a molding compound resin body containing the phosphor (step S65). The molding compound resin body thus formed is ground into a powder (step S67), and is pressurized at a predetermined pressure to produce a molding compound resin tablet in which the phosphor is uniformly dispersed (step S69).

Subsequently, the kneaded mixture is stabilized to form a molding compound resin body containing the phosphor (step S65). The solid state molding compound resin body is ground into a powder (step S67). Finally, a predetermined pressure is applied to the resin powder to produce a molding compound resin tablet in which the phosphor is uniformly dispersed (step S69).

The method for producing a molding compound resin tablet for wavelength conversion according to the present invention enables uniform dispersion of a phosphor powder in a mixture for forming a liquid or gelled resin, thereby producing a molding compound resin tablet for wavelength conversion which is capable of ensuring wavelength conversion. In conclusion, the molding compound resin tablet for wavelength conversion can be advantageously employed in the formation of a phosphor layer for manufacturing a white light emitting diode by a transfer molding process.

That is, according to the method of the present invention, a phosphor powder is subjected to a wet dispersion process using a translucent liquid resin to form a molding compound resin body in which the phosphor powder is dispersed, the molding compound resin body is ground into a powder, and then the resin powder is pressurized at a predetermined pressure to form a molding compound resin tablet. Thereafter, the molding compound resin tablet in which the phosphor is dispersed is subjected to a transfer molding process on a package structure on which a blue or UV light emitting diode is mounted, thereby manufacturing a white light emitting diode.

Figure 7:
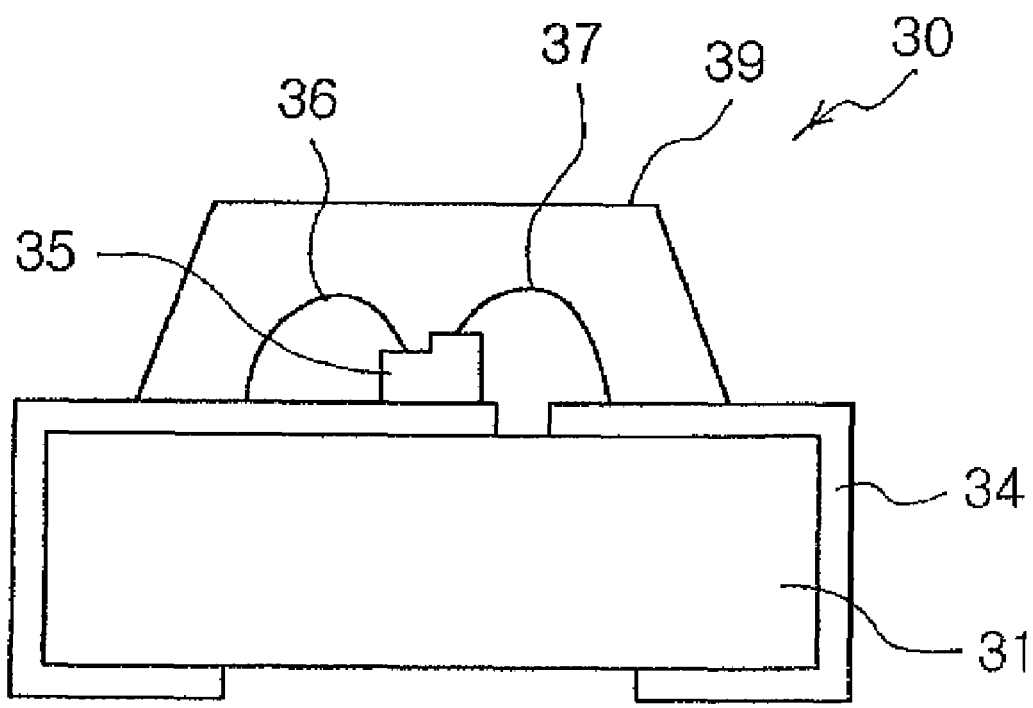
FIG. 7 is a side cross-sectional view of a white light emitting diode manufactured by a method of the present invention.

FIG. 7 shows one example of a white light emitting diode 30 manufactured by the method of the present invention. Referring to FIG. 7, a blue or UV light emitting diode 35 is arranged on a package substrate 31 in which two lead frames 33 and 34 are formed. Two electrodes (now shown) of the blue or UV light emitting diode 35 are electrically connected to the lead frames 33 and 34 through the wires 36 and 37, respectively. The molding compound resin tablet for wavelength conversion produced in accordance with the method of the present invention is subjected to a transfer molding process on the light emitting diode 35 so as to surround the light emitting diode 35 to form a molding portion 39 for wavelength conversion on the package substrate 31. Of course, those skilled in the art will understand that the entire structure of the white light emitting diode and the shape of the molding portion for wavelength conversion can be variously modified depending on a transfer molding apparatus used.

The molding compound resin tablet for wavelength conversion produced in accordance with the present invention includes a phosphor powder uniformly dispersed therein. In addition, the molding portion 39 for wavelength conversion is formed for a relatively short curing time by a transfer molding process. Accordingly, adverse effects due to the precipitation of the phosphor particles can be avoided.

The light emitting characteristics of the white light emitting diode manufactured by the method of the present invention were compared with those of a white light emitting diode manufactured by a conventional method.

EXAMPLE

Figure 1:
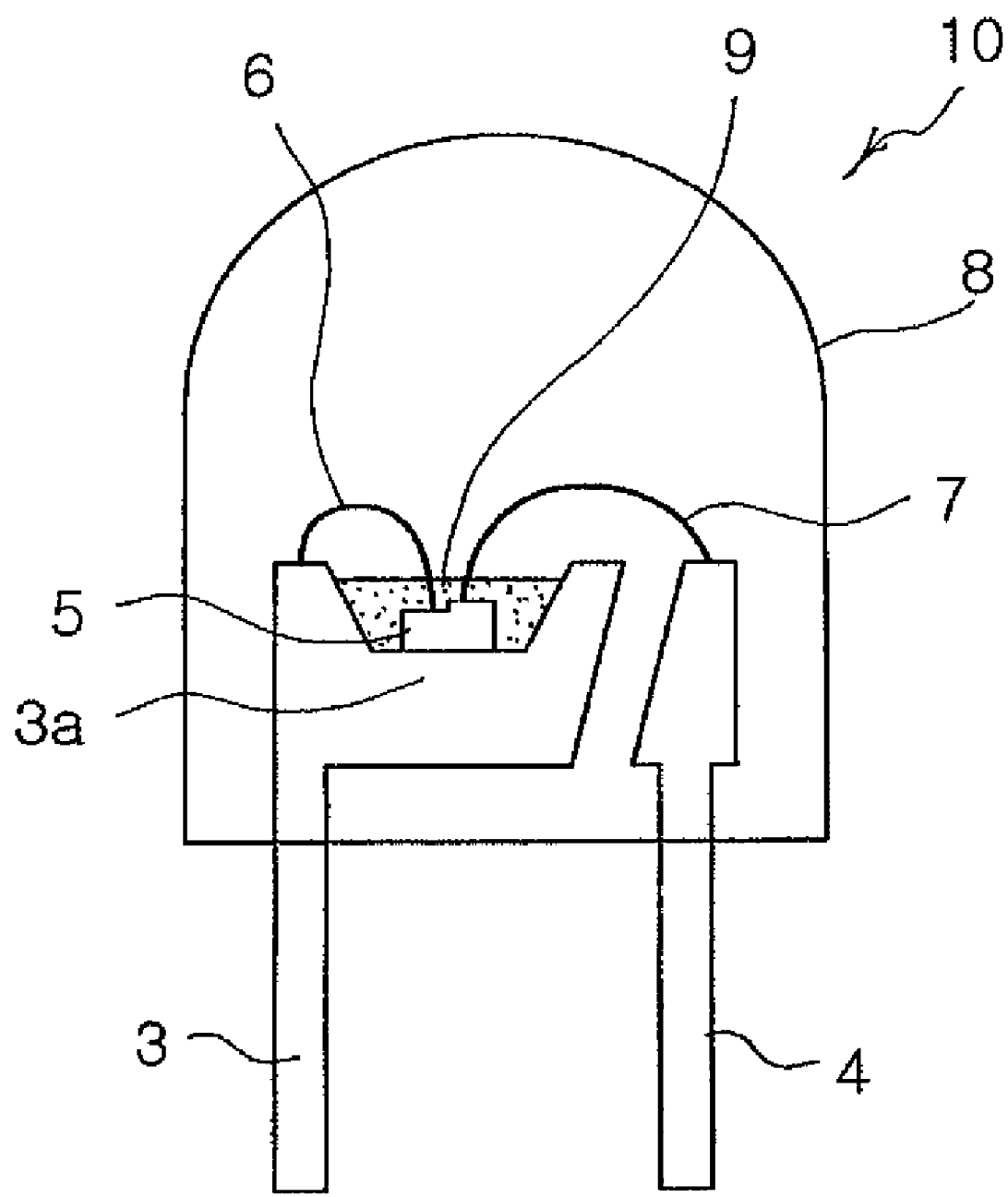
FIG. 1 is a side cross-sectional view of a conventional white light emitting diode.
Figure 2:
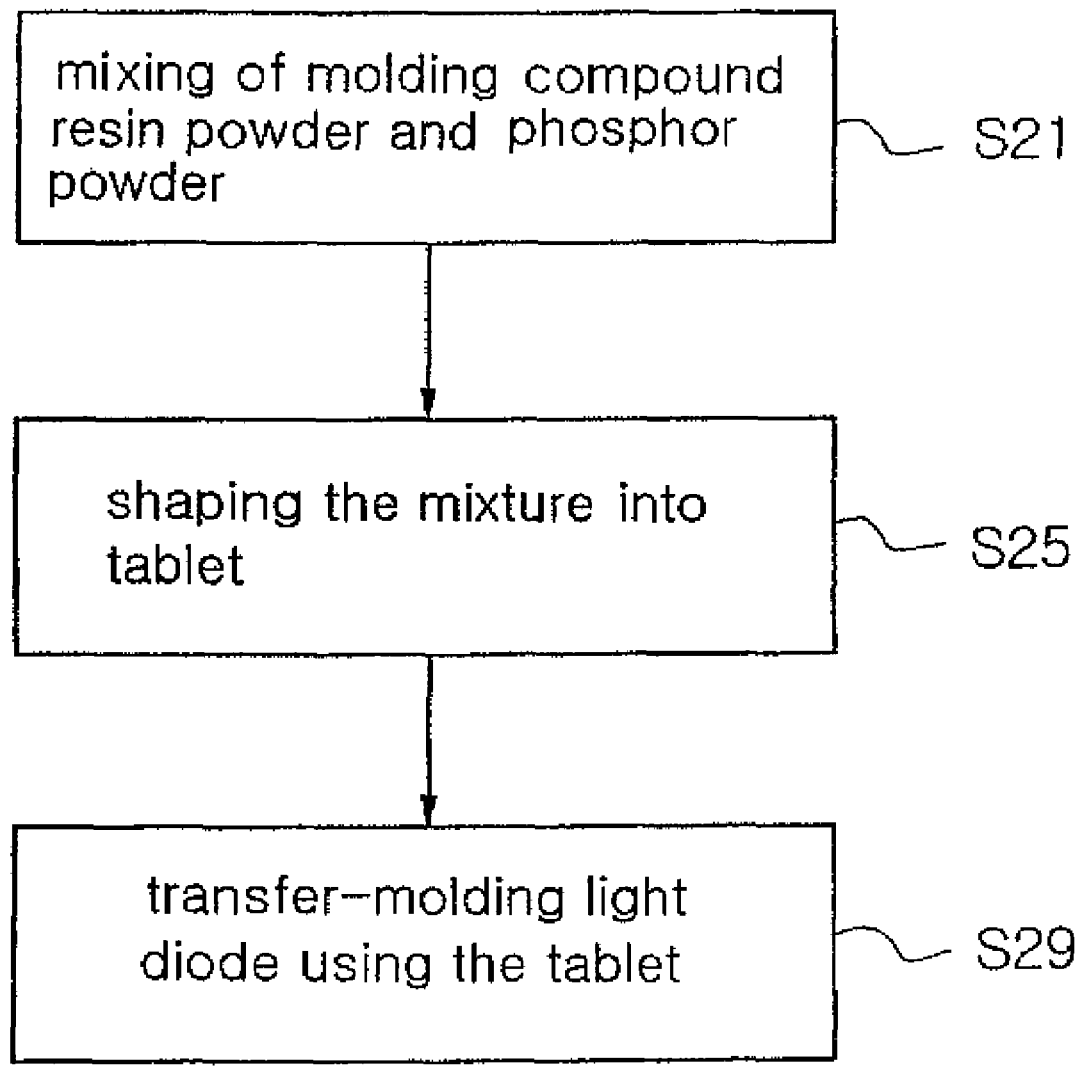
FIG. 2 is a flow chart schematically illustrating a conventional method for manufacturing a white light emitting diode.

In accordance with the conventional method shown in FIG. 2, first an epoxy molding compound resin powder and a YAG-based phosphor powder were prepared so as to have substantially the same average particle diameter (about 7 μm), and were then sufficiently mixed with each other. Thereafter, the mixture was pressurized to produce an epoxy molding compound resin tablet containing the phosphor powder. The tablet was subjected to a transfer molding process to form a molding portion for wavelength conversion on a package structure employing a light emitting diode at a wavelength band of 460 nm so as to have a structure similar to that shown in FIG. 7.

On the other hand, an epoxy molding compound resin tablet in which a phosphor powder was uniformly dispersed was produced in accordance with the method of the present invention shown in FIG. 5. Specifically, a liquid epoxy resin as a base resin was mixed with a phosphor powder having an average particle diameter of about 7 μm, and then a curing agent was added thereto. During mixing, a catalyst and a coupling agent were further added and mixed.

The kind and amount of the curing agent and each additive used in this Example was identical to those of the curing agent and each additive employed for the formation of the molding compound resin used in the conventional method. Next, a kneading process and a roll milling process were performed on the gelled mixture, and then the resulting mixture was quenched to produce a solid state molding compound resin body.

Subsequently, the resin body was ground into a powder having an average particle diameter of about 7 μm, and was then pressurized to produce a molding compound resin tablet in which the phosphor is uniformly dispersed. The tablet was subjected to a transfer molding process to form a molding portion for wavelength conversion on a package structure employing a light emitting diode at a wavelength band of 460 nm so as to have a structure similar to that shown in FIG. 7.

Color region coordinates of each white light emitting diode manufactured in accordance with the conventional method and this Example were analyzed. The results are shown in FIGS. 8*a* and 8*b*.

Figure 8A:
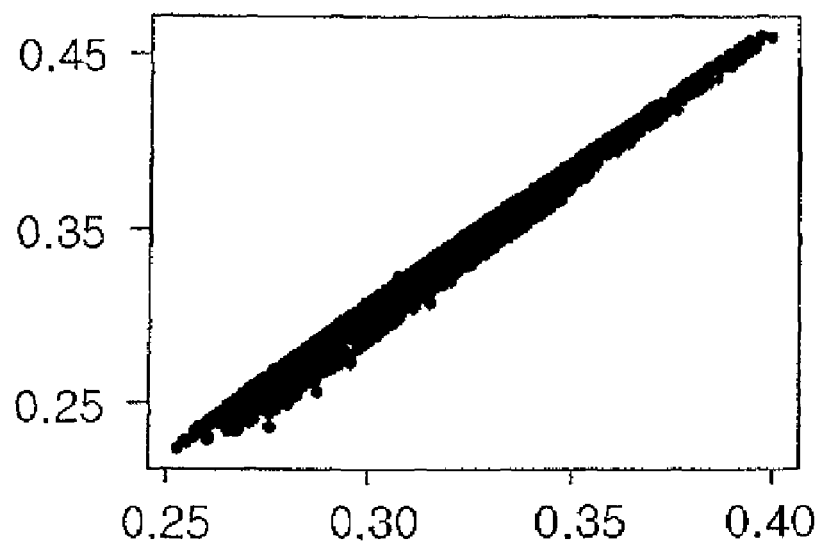
FIGS. 8a and 8b are color coordinates of a white light emitting diode manufactured by a conventional method and a white light emitting diode manufactured by a method of the present invention, respectively.

Referring to FIG. 8*a*, it was confirmed that the color region of the white light emitting diode manufactured by the conventional method was broadly distributed on the color coordinate. It was observed that the white light emitting diode emitted bluish white light and yellowish white light other than white light. This is because the tablet was produced in a state wherein the resin and the phosphor powders were non-uniformly dispersed due to abrasion between particles upon mixing and/or differences in specific gravity of the powders.

Figure 8B:
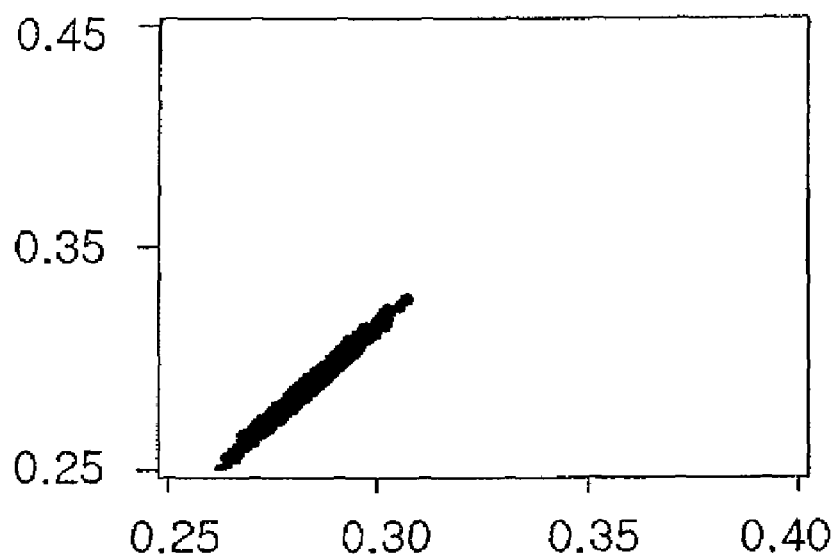

On the contrary, as shown in FIG. 8*b*, the white light emitting diode manufactured in accordance with this Example was shown to have a sharp color region (X: 0.28~0.30, Y: 0.25~0.32). That is, it was confirmed that little or no bluish white light and yellowish white light was emitted and substantially all light was converted to white light. This high light conversion efficiency is because the phosphor powder was uniformly distributed in the molding compound resin tablet produced in accordance with the method of the present invention and further the uniform distribution could be maintained in the transfer molding process having a relatively short curing time.

As apparent from the above description, according to the method of the present invention, since a wet dispersion process using a translucent liquid resin is employed to produce a molding compound resin tablet, instead of simple mixing of powders, uniform dispersion of a phosphor powder in the molding compound resin tablet can be ensured. In addition, since the phosphor powder can be uniformly dispersed by a mixing or kneading process for the formation of a molding compound resin body, without the need for further processing, the entire production process can be simplified.

Furthermore, since the method for manufacturing a white light emitting diode of the present invention employs the production method of the molding compound resin tablet, little or no precipitation of phosphor particles in the molding compound tablet takes place and uniform dispersion of the phosphor particles is maintained, thus enabling the manufacture of a white light emitting diode having high wavelength conversion efficiency.

The present invention has been described herein with reference to its preferred embodiments and the accompanying drawings. These embodiments and drawings do not serve to limit the present invention, but are set forth for illustrative purposes. The scope of the present invention is defined by the claims that follow. Those skilled in the art will appreciate that various modifications, additions and substitutions are possible, without departing from the scope and spirit of the invention as disclosed in the accompanying claims.

What is claimed is:

1. A method for manufacturing a white light emitting diode molded with a molding compound resin for wavelength conversion in which the phosphor converting at least a portion of wavelengths is uniformly dispersed, the method comprising the steps of:
   wet-dispersing a phosphor powder in a translucent liquid resin to form a molding compound resin body in which the phosphor powder is dispersed;
   grinding the molding compound resin body into a powder form, and applying a predetermined pressure to the resin powder to produce a molding compound in a tablet form; and
   transfer-molding the molding compound tablet on a package structure on which a blue or UV light emitting diode is mounted.

2. The method according to claim 1, wherein the step of forming the molding compound resin body includes the sub-steps of:
   mixing the translucent liquid resin, a material containing at least a curing agent and the phosphor powder;
   kneading the mixture in a gel state; and
   stabilizing the kneaded mixture to form the molding compound resin body containing the phosphor.

3. The method according to claim 2, wherein the kneading is carried out at a temperature between about 100° C. and about 120° C., and the formation of the molding compound resin body is carried out by quenching the kneaded mixture.

4. The method according to claim 2, further comprising the sub-step of roll-milling the kneaded mixture after the kneading and before the stabilization.

5. The method according to claim 2, wherein, in the mixing step, the phosphor powder is simultaneously mixed with the translucent liquid resin and the material containing at least a curing agent.

6. The method according to claim 2, wherein, in the mixing step, the translucent liquid resin and the phosphor powder are first mixed (1st mixing), and then the material containing at least a curing agent is added to the mixture and mixed (2nd mixing).

7. The method according to claim 2, wherein, in the mixing step, the translucent liquid resin and the material containing at least a curing agent are first mixed (1st mixing), and then the phosphor powder is added to the mixture (2nd mixing).

8. The method according to claim 7, wherein the 2nd mixing is carried out by adding at least one agent selected from a catalyst and a coupling agent together with the phosphor powder, and mixing.

9. The method according to claim 7, wherein at least one agent selected from a catalyst and a coupling agent and the phosphor powder are added in a mixture form obtained by the same milling process.

10. The method according to claim 2, wherein the step of forming the molding compound resin body containing the phosphor is carried out by mixing the translucent liquid resin and the material containing at least a curing agent to form a gelled mixture, kneading the gelled mixture and the phosphor powder, and stabilizing the kneaded mixture to form the molding compound resin body.

11. The method according to claim 10, wherein the kneading is carried out at a temperature between about 100° C. and about 120° C., and the formation of the molding compound resin body is carried out by quenching the kneaded mixture.

12. The method according to claim 10, further comprising the sub-step of roll-milling the kneaded mixture after the kneading and before the stabilization.

13. The method according to claim 1, wherein the phosphor includes at least one element selected from the group consisting of Y, Lu, Sc, La, Gd, Ce and Sm, and at least one element selected from the group consisting of Al, Ga and In.

14. The method according to claim 1, wherein the translucent liquid resin is an epoxy resin.

* * * * *